United States Patent
Chen et al.

(10) Patent No.: US 11,532,528 B2
(45) Date of Patent: Dec. 20, 2022

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Chi-Jen Chen, Taichung (TW);
Hsi-Chang Hsu, Taichung (TW);
Yuan-Hung Hsu, Taichung (TW);
Chang-Fu Lin, Taichung (TW);
Don-Son Jiang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 87 days.

(21) Appl. No.: 17/160,720

(22) Filed: Jan. 28, 2021

(65) Prior Publication Data
US 2022/0181225 A1 Jun. 9, 2022

(30) Foreign Application Priority Data
Dec. 4, 2020 (TW) ................................ 109142862

(51) Int. Cl.
*H01L 23/31* (2006.01)
*H01L 23/00* (2006.01)
*H01L 21/56* (2006.01)
*H01L 21/48* (2006.01)

(52) U.S. Cl.
CPC .......... *H01L 23/31* (2013.01); *H01L 21/4853* (2013.01); *H01L 21/56* (2013.01); *H01L 23/562* (2013.01); *H01L 24/14* (2013.01)

(58) Field of Classification Search
CPC .. H01L 23/28–23/3192; H01L 25/0655; H01L 25/072; H01L 25/0753; H01L 25/115
See application file for complete search history.

(56) References Cited

U.S. PATENT DOCUMENTS

| | | | |
|---|---|---|---|
| 2011/0316156 A1* | 12/2011 | Pagaila | H01L 21/561 257/738 |
| 2021/0202318 A1* | 7/2021 | Ko | H01L 25/16 |

\* cited by examiner

*Primary Examiner* — Selim U Ahmed
*Assistant Examiner* — Evan G Clinton
(74) *Attorney, Agent, or Firm* — Kelly & Kelley, LLP

(57) ABSTRACT

An electronic package and a method for manufacturing the electronic package are provided. The method includes forming a slope surface on at least one side surface of at least one of a plurality of electronic components, and then disposing the plurality of electronic components on a carrier structure, such that the two adjacent electronic components form a space by the slope surface. Afterwards, an encapsulation layer is formed on the carrier structure and filled into the space to cover the two adjacent electronic components so as to disperse stress on the electronic components through the design of the space to prevent cracking due to stress concentration.

18 Claims, 8 Drawing Sheets

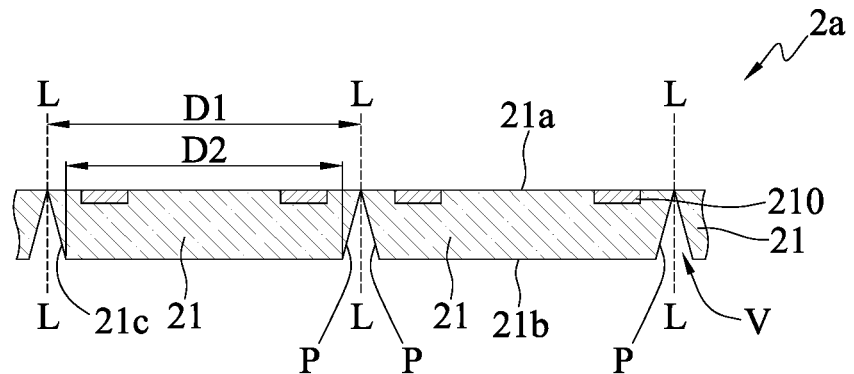
FIG. 2A
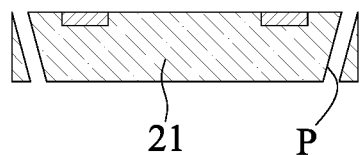
FIG. 2A'
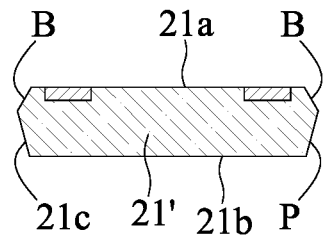
FIG. 2A"

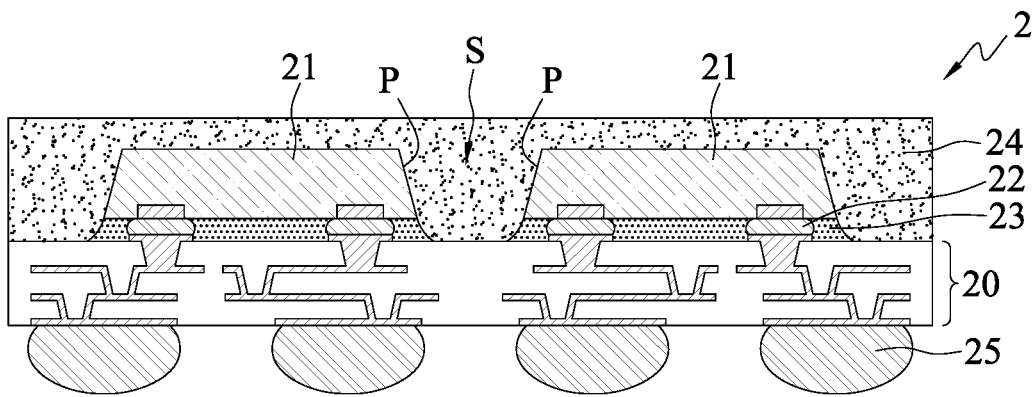
FIG. 2C
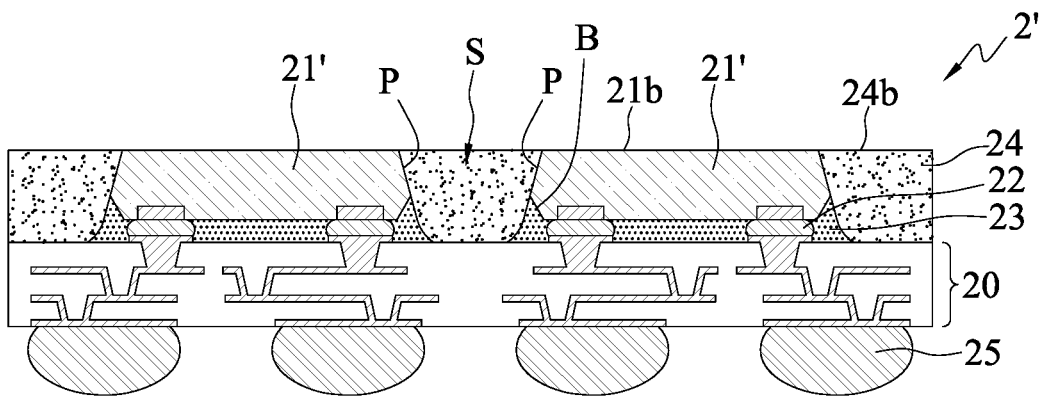
FIG. 2C'
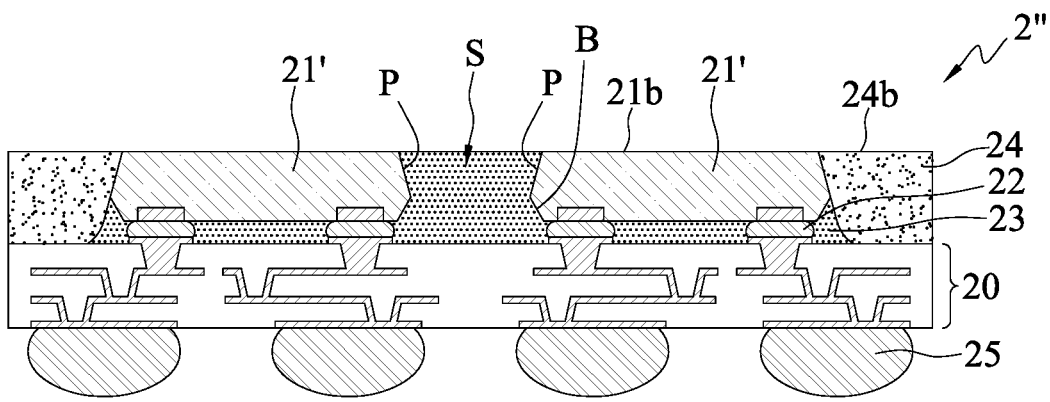
FIG. 2C"

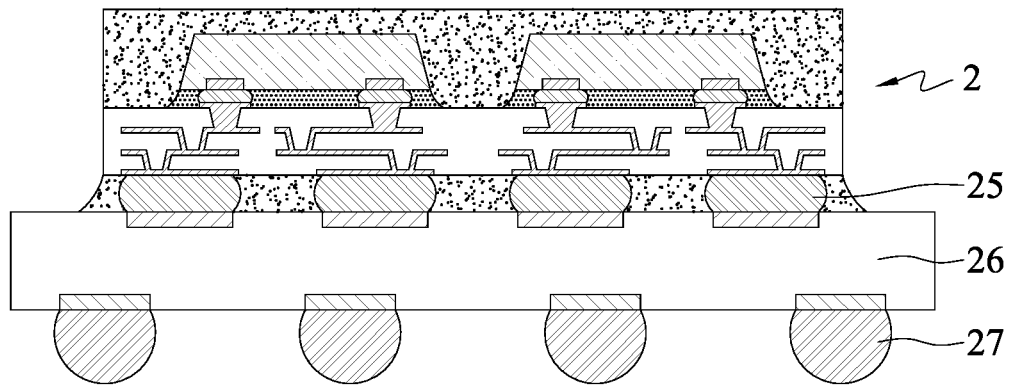
FIG. 2D
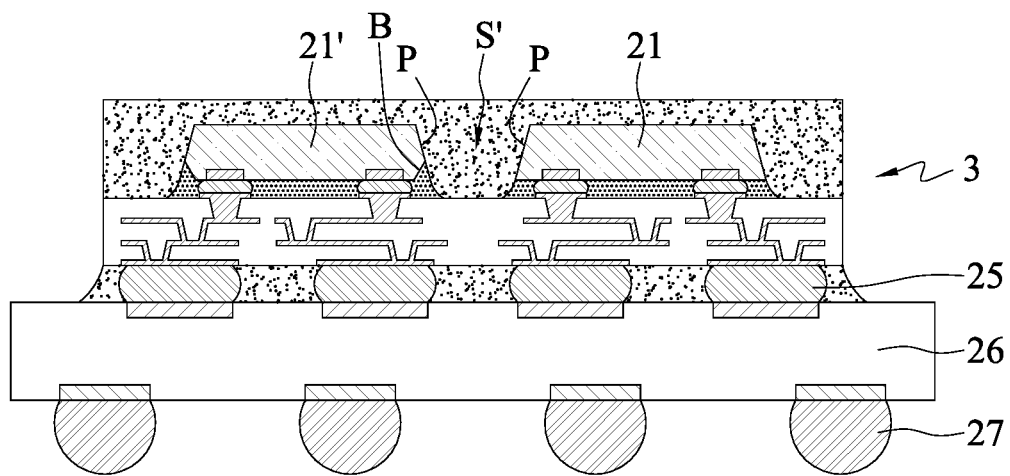
FIG. 2D'
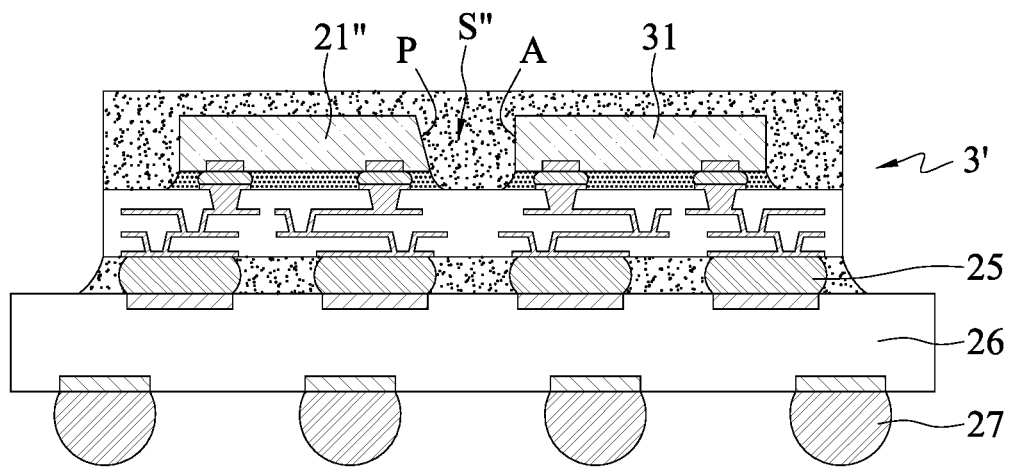
FIG. 2D"

ELECTRONIC PACKAGE AND MANUFACTURING METHOD THEREOF

BACKGROUND

1. Technical Field

The present disclosure relates to a semiconductor device, and more specifically, to a flip-chip electronic package and a manufacturing method thereof.

2. Description of Related Art

With the rapid development in electronic industry, electronic products are trending towards multiple functions and high performance Techniques currently used in the field of chip packaging include flip-chip packaging modules, such as Chip Scale Package (CSP), Direct Chip Attached (DCA) or Multi-Chip Module (MCM), or chip stacking techniques involving stacking chips one on top of another to be integrated into a three-dimensional (3D) integrated circuit (IC) module.

FIG. 1 is a schematic cross-sectional view depicting a semiconductor package 1 in the form of a conventional 3D IC stack. First, a through silicon interposer (TSI) 10 with a transfer side 10a and a chip placement side 10b opposite to each other is provided. The TSI 10 includes a plurality of conductive through-silicon vias (TSVs) 100 interconnected between the chip placement side 10b and the transfer side 10a. A circuit structure 101 is formed on the chip placement side 10b for connection and placement of several semiconductor components 11 having a plurality of solder bumps 12. The solder bumps 12 are then covered by an underfill 13, and an encapsulation layer 14 is formed to cover the semiconductor components 11. The encapsulation layer 14 is then polished, such that the upper surfaces of the semiconductor components 11 are exposed from the encapsulation layer 14. Thereafter, the TSI 10 is disposed on a package substrate 16 via a plurality of conductive components 15 with the transfer side 10a. The package substrate 16 is electrically connected with the conductive TSVs 100, and the conductive components 15 are covered by an underfill 17. Then, an encapsulant 18 is formed on the package substrate 16 to encapsulate the encapsulation layer 14 and the TSI 10. Finally, a plurality of solder balls 160 are formed on the lower side of the package substrate 16 for connection and placement on a circuit board 19.

However, in the conventional semiconductor package 1, during packaging, the underfill 13 or the encapsulation layer 14 may be formed at the corners or edges of non-active faces of the semiconductor components 11. This may result in an increase in the internal stress of the semiconductor components 11 and the issue of stress concentration, leading to the occurrence of cracks, and thus lowering the reliability of the semiconductor package 1.

Therefore, there is a need for a solution that addresses the aforementioned issues of the prior art.

SUMMARY

In view of the aforementioned shortcomings of the prior art, the present disclosure provides an electronic package, which may include: a carrier structure; a plurality of electronic components disposed at intervals on the carrier structure, wherein each of the electronic components includes an active face, a non-active face opposite to the active face, and side faces adjacent to and interconnected between the active face and the non-active face, wherein a width of the active face of at least one of the plurality of electronic components is greater than a width of the non-active face, such that a slope surface is formed on at least one of the side faces of the at least one of the plurality of electronic components, and wherein a space is formed between the two adjacent electronic components, such that at least one side of the space includes the slope surface; and an encapsulation layer formed on the carrier structure for encapsulating the plurality of electronic components.

The present disclosure further provides a method of manufacturing an electronic package, which may include: providing a plurality of electronic components, wherein each of the electronic components includes an active face, a non-active face opposite to the active face, and side faces adjacent to and interconnected between the active face and the non-active face, and wherein a width of the active face of at least one of the plurality of electronic components is greater than a width of the non-active face, such that a slope surface is formed on at least one of the side faces of the at least one of the plurality of electronic components; disposing the plurality of electronic components at intervals on a carrier structure to form a space between the two adjacent electronic components, wherein at least one side of the space includes the slope surface; and forming an encapsulation layer on the carrier structure for encapsulating the plurality of electronic components.

In the aforementioned electronic package and manufacturing method thereof, structures of the plurality of electronic components are different from one another.

In the aforementioned electronic package and manufacturing method thereof, the active faces of the electronic components include a plurality of electrode pads electrically connected with the carrier structure.

In the aforementioned electronic package and manufacturing method thereof, a chamfer is formed at a corner between the active face and the side face of the electronic components.

In the aforementioned electronic package and manufacturing method thereof, a width of the space gradually reduces as the width of the space gets towards the carrier structure.

In the aforementioned electronic package and manufacturing method thereof, the electronic components are electrically connected with the carrier structure via a plurality of conductive bumps. Furthermore, before forming the encapsulation layer, a covering layer is formed between the electronic components and the carrier structure, wherein the plurality of conductive bumps are covered by the covering layer, and the covering layer is covered by the encapsulation layer when forming the encapsulation layer.

In the aforementioned electronic package and manufacturing method thereof, the non-active faces of the electronic components are exposed from the encapsulation layer.

In the aforementioned electronic package and manufacturing method thereof, a plurality of the spaces are formed by the plurality of electronic components.

The aforementioned electronic package and manufacturing method thereof may further include forming a plurality of conductive components on a side of the carrier structure opposite to the side that the electronic components are disposed on.

As can be understood from the above, the electronic package and the manufacturing method thereof in accordance with the present disclosure reduces the stress in the electronic components exerted by the encapsulation layer by a space between two adjacent electronic components that is at least formed from a slope surface on at least one side face of the electronic components. Thus, compared to the prior art, the present disclosure is capable of dispersing stress in the electronic components to prevent cracking of the electronic components due to concentrated stress and improve the reliability of the electronic package.

BRIEF DESCRIPTION OF THE DRAWINGS

FIG. 2A to FIG. 2C are schematic cross-sectional views illustrating a manufacturing method of an electronic package in accordance with the present disclosure.

FIG. 2A' is a schematic cross-sectional view of FIG. 2A manufactured in another way.

FIG. 2A" is a schematic cross-sectional view depicting another aspect of FIG. 2A.

FIG. 2C' and FIG. 2C" are schematic cross-sectional views depicting other aspects of FIG. 2C.

FIG. 2D is a schematic cross-sectional view of a manufacturing step subsequent to FIG. 2C.

FIG. 2D' and FIG. 2D" are schematic cross-sectional views depicting other aspects of FIG. 2D.

FIG. 3A-1 to FIG. 3A-5 are partial bottom schematic views of various aspects of FIG. 2A.

FIG. 4 is a schematic cross-sectional view depicting another aspect of FIG. 2D.

DETAILED DESCRIPTION

The ways in which the present disclosure can be implemented are illustrated in the following embodiments. One of ordinary skill in the art can readily appreciate other advantages and technical effects of the present disclosure based on the disclosed contents herein.

It should be noted that the structures, ratios, sizes shown in the appended drawings are to be construed in conjunction with the disclosures herein in order to facilitate understanding of those skilled in the art. They are not meant, in any way, to limit the implementations of the present disclosure, and therefore contain no substantial technical meaning. Without influencing the effects created and the objectives achieved by the present disclosure, any modifications, changes or adjustments to the structures, ratios or sizes should fall within the scope encompassed by the technical contents disclosed herein. Meanwhile, the use of terms such as "above" and the like in this specification are for illustrative purposes, and are not meant to limit the scope in which the present disclosure can be implemented. Any variations or modifications made to their relative relationships, without changing the substantial technical contents, are also to be construed as within the scope of the present disclosure.

Figure 1:
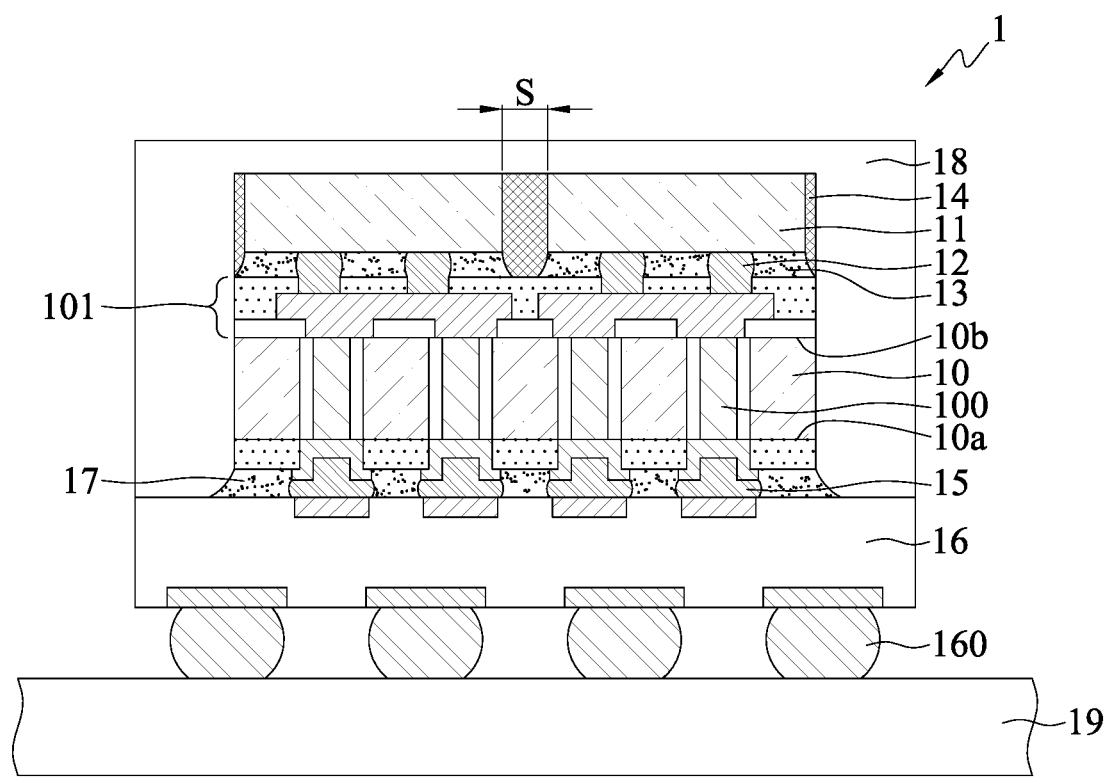
FIG. 1 is a schematic cross-sectional view of a conventional semiconductor package.
Figure 2B:
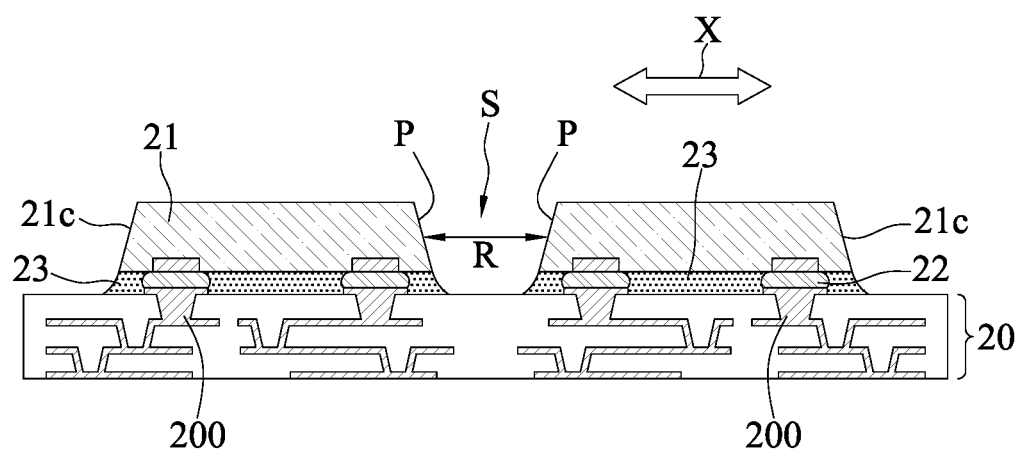
Figures 1, 3A:
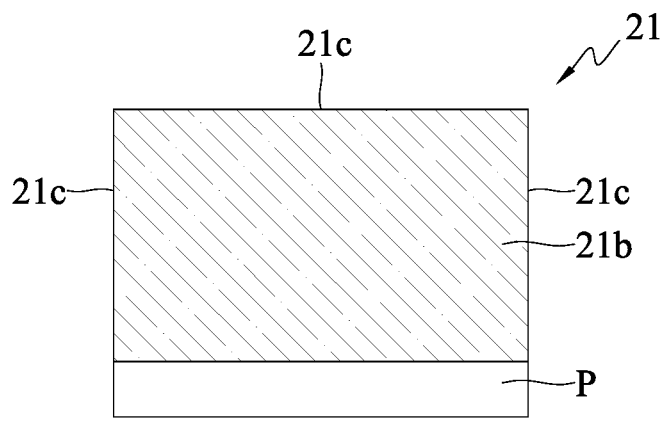
Figures 2, 3A:
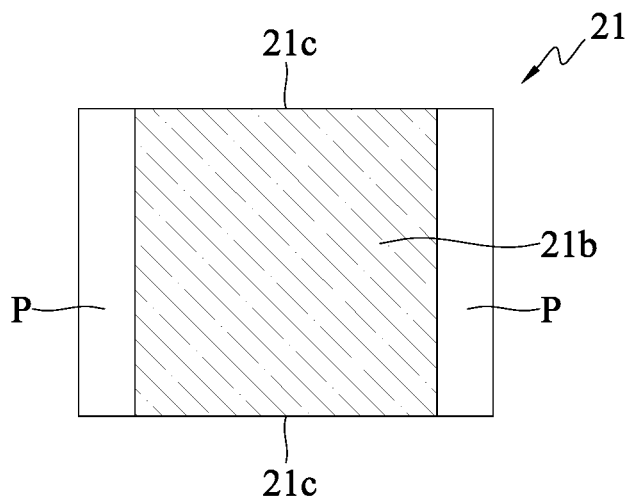
Figures 3, 3A:
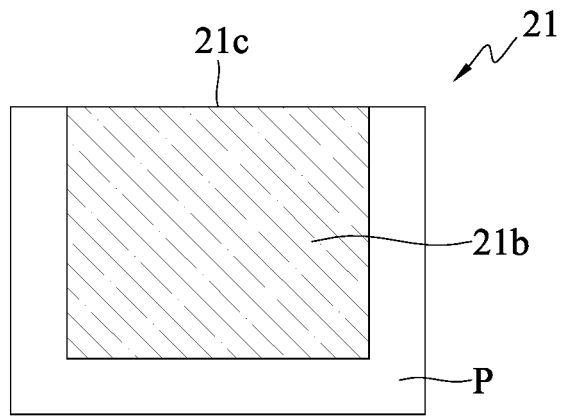
Figures 3, 3A, 4:
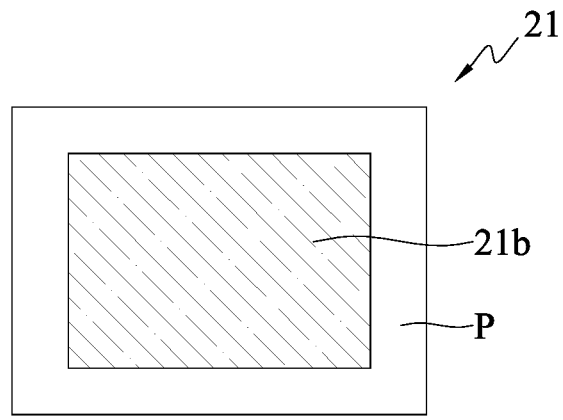
Figures 3, 3A, 4, 5:
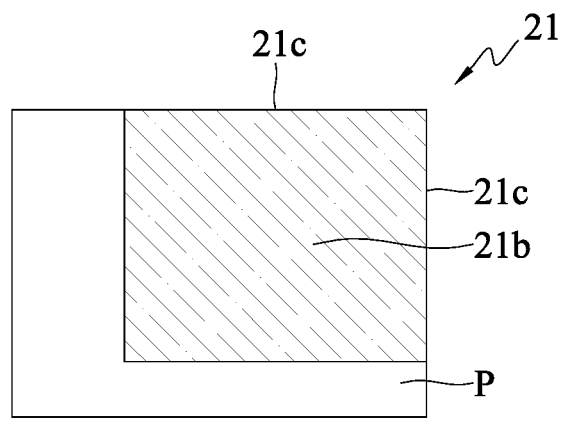
Figure 4:
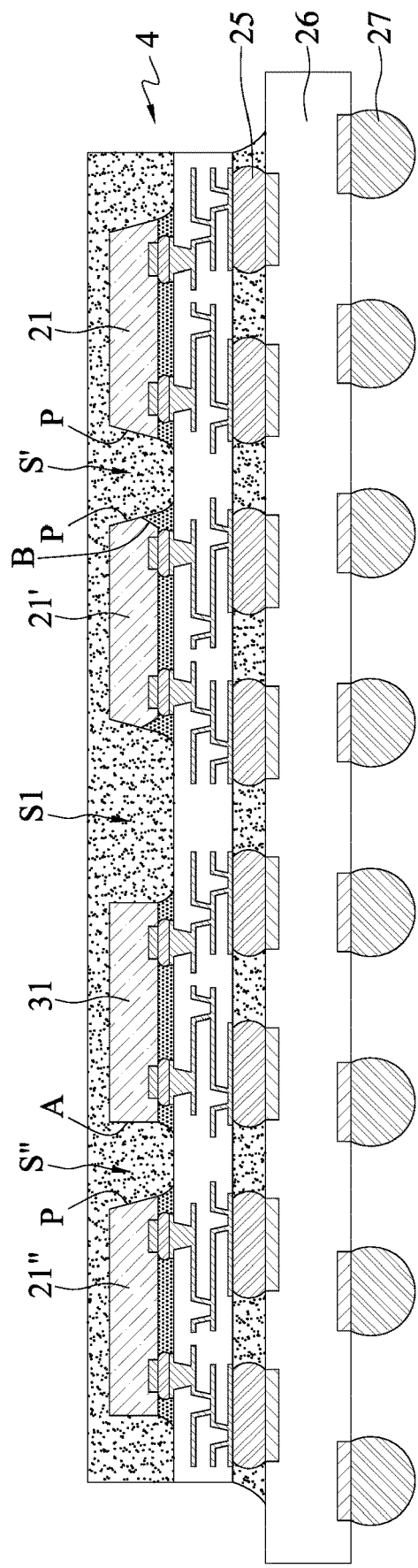

FIG. 2A to FIG. 2C are schematic cross-sectional views illustrating a manufacturing method of an electronic package 2 in accordance with the present disclosure.

As shown in FIG. 2A, a panel-form substrate structure 2a is provided, which includes a plurality of electronic components 21 arranged in an array, and at least one side face 21c of each of the electronic components 21 is a slope surface P.

Each of the electronic components 21 can be an active component, a passive component, a package structure or a combination thereof, wherein the active component can be, for example, a semiconductor chip, and the passive component can be, for example, a resistor, a capacitor, or an inductor. In an embodiment, the electronic component 21 can be a semiconductor chip with an active face 21a and a non-active face 21b opposite to each other, and the side face 21c (or the slope surface P) is adjacent to and interconnected between the active face 21a and the non-active face 21b. A plurality of electrode pads 210 are provided on the active face 21a. For example, the width D1 of the active face 21a is greater than the width D2 of the non-active face 21b, such that the side face 21c forms the slope surface P.

Moreover, the slope surfaces P at the side faces 21c of the electronic components 21 can be formed using cutting tools for the singulation process to create for example, tapered gaps V shown in FIG. 2A. Alternatively, as shown in FIG. 2A', the side faces 21c of the electronic components 21 can be formed with the slope surfaces P by tool shaping (e.g., grinding or cutting) after the singulation process.

In addition, as shown in FIG. 2A", chamfers B can be formed at the corners between the active face 21a and the side faces 21c of the electronic component 21' depending on the needs.

Furthermore, the slope surfaces P can be provided on at least one side face 21c of the electronic component 21 depending on the needs. For example, the active faces 21a and the non-active faces 21b of the electronic components 21 shown in FIG. 3A-1 to FIG. 3A-5 are quadrilaterals, such as squares. It can be appreciated that the electronic components 21, 21' may take numerous shapes and forms, and the present disclosure is not limited to these.

As shown in FIG. 2B, subsequent to the manufacturing steps described with respect to FIG. 2A, a singulation process is performed on the panel-form substrate structure 2a along cutting paths L shown in FIG. 2A to separate the various electronic components 21. Then, at least two electronic components 21 are arranged at intervals along a horizontal direction X on a panel-form or a wafer-form carrier structure 20. The slope surfaces P of the two adjacent electronic components 21 are disposed side by side (for example, the slope surfaces P are in the form of slides), such that a space S is formed between the two adjacent electronic components 21.

The carrier structure 20 can be a package substrate including a core layer and a circuit structure or a coreless circuit structure. In terms of the structure of the carrier structure 20, a plurality of circuit layers 200 (e.g., redistribution layers [RDLs]) are formed on a dielectric material. In an embodiment, the carrier structure 20 is a coreless circuit structure. However, in other embodiments, the carrier structure 20 can also be a semiconductor substrate with a plurality of conductive through-silicon vias (TSVs) to be used as a through silicon interposer (TSI). It can be appreciated that the carrier structure 20 may also be other types of carrier units for carrying electronic components (e.g., chips), such as a lead frame, and the present disclosure is not limited as such.

Furthermore, the width R of the space S is not uniform across the height of the space S (i.e., from the top side or the side that is further from the carrier structure 20 to the bottom side or the side that is closer to the carrier structure 20). For example, the width R of the space S may gradually decrease as it gets towards the bottom side (i.e., towards the carrier structure 20) from the top side, i.e., the space S is tapered. Thus, the stress on the electronic components 21 can be lessened as a result of these variations in the width R.

Moreover, conductive bumps 22 are formed on respective electrode pads 210 of the electronic components 21, such that the electronic components 21 can be electrically connected to the circuit layers 200 of the carrier structure 20 via the conductive bumps 22 using the flip-chip technique. A covering layer 23 is formed between the active faces 21a and the carrier structure 20 to cover the conductive bumps 22. For example, the conductive bumps 22 can be metal pillars (e.g., copper pillars), solder materials, or a combination thereof. The covering layer 23 is an underfill.

In addition, in an embodiment, the electronic components 21 are of the same type (i.e., active components), and the internal structures of the electronic components 21 can be the same or different.

As shown in FIG. 2C, an encapsulation layer 24 is formed on the carrier structure 20 to encapsulate the covering layer 23 and the electronic components 21. Thereafter, a plurality of conductive components 25 (e.g., solder balls) are formed on the lower side (or ball-planting side) of the carrier structure 20. Then, the singulation process is performed to obtain the electronic package 2.

The encapsulation layer 24 can be an insulating material, such as polyimide (PI), a dry film, epoxy resin, a molding compound or other suitable materials. In an embodiment, the encapsulation layer 24 is formed on the carrier structure 20 by lamination or molding, and the space S is filled with the encapsulation layer 24.

Moreover, the Young's modulus of the encapsulation layer 24 is greater than that of the covering layer 23. In an embodiment, the Young's modulus of the encapsulation layer 24 is above 20 GPa.

Furthermore, the non-active faces 21b of the electronic components 21 and the upper surface 24b of the encapsulation layer 24 can become coplanar through a planarization or thinning process, such as that shown in FIG. 2C', wherein the non-active faces 21b of the electronic components 21 are exposed from the encapsulation layer 24. For example, when the encapsulation layer 24 is formed on the carrier structure 20, the encapsulation layer 24 covers the non-active faces 21b of the electronic components 21, then part of the encapsulation layer 24 is removed by grinding or cutting (part of the non-active faces 21b of the electronic components 21 can be also removed if needed), so that the non-active faces 21b of the electronic components 21 are flush with the upper surface 24b of the encapsulation layer 24.

In addition, if manufacturing is carried out subsequent to FIG. 2A" (wherein the electronic components 21' have chamfers B), then an electronic package 2' can be obtained as shown in FIG. 2C'. Alternatively, the space S can be filled with the covering layer 23, such as an electronic package 2" shown in FIG. 2C".

As shown in FIG. 2D, in subsequent manufacturing steps, the electronic package 2 shown in FIG. 2C (or the electronic package 2' shown in FIG. 2C') can be placed and connected onto a printed circuit board (PCB) or another electronic device 26 with circuitry. A plurality of solder balls 27 can be implanted under the PCB or the another electronic device 26 with circuitry.

It can be appreciated that the electronic components 21, 21', 21", 31 of different aspects can be provided in an electronic package 3, 3' as shown in FIG. 2D' or FIG. 2D", thereby forming various types of spaces S', S". For example, at least one side of space S' is a slope surface P, and another side is a slope surface P with a chamfer B. Alternatively, at least one side of space S" is a slope surface P, and another side is a straight face A. Alternatively, in an electronic package 4 shown in FIG. 4, a plurality of electronic components 21, 21', 21", 31 are provided, and a plurality of spaces S', S", S1 are formed between the electronic components 21, 21', 21", 31.

On another aspect, these electronic components 21 can also be of different types. For example, one electronic component 21 (active component) is an application specific integrated circuit (ASIC) semiconductor chip, while another electronic component 21 is a package structure, including a package module having encapsulation materials, a control chip and at least one high bandwidth memory (HBM) chip, wherein the conductive bumps 22 are electrically combined by the control chip.

Therefore, the manufacturing method of the present disclosure includes forming a slope surface P on at least one side face 21c of an electronic component 21, 21', 21", such that a space S, S', S", S1 formed by the slope surface P of at least one of two adjacent electronic components 21, 21', 21" can be used as a stress buffering zone to reduce the stress applied by the encapsulation layer 24 in the electronic components 21, 21', 21", 31, that is, to prevent an increase in the internal stress in the electronic components 21, 21', 21", 31. Thus, compared to the prior art, the manufacturing method of the present disclosure is capable of dispersing the stress in the electronic components 21, 21', 21", 31 to avoid cracking of the electronic components 21, 21', 21", 31 due to concentrated stress, thereby improving the reliability of the electronic package 2, 2', 2", 3, 3', 4.

Furthermore, by filling the space S with the encapsulation layer 24, the covering layer 23 and/or other suitable materials, the strength of the space S, S', S", S1 can be strengthened and cracking of the electronic package 2, 2', 2", 3, 3', 4 due to stress concentration in the electronic components 21, 21', 21", 31 can be prevented.

The present disclosure further provides an electronic package 2, 2', 2", 3, 3', 4, which includes: a carrier structure 20, a plurality of electronic components 21, 21', 21", 31, and an encapsulation layer 24.

The plurality of electronic components 21, 21', 21", 31 are disposed at intervals on the carrier structure 20, wherein each of the electronic components 21, 21', 21", 31 includes an active face 21a, a non-active face 21b opposite to the active face 21a, and side faces 21c adjacent to and interconnected between the active face 21a and the non-active face 21b. The width D1 of the active face 21a of at least one of the plurality of electronic components 21, 21', 21", 31 is greater than the width D2 of the non-active face 21b, so a slope surface P is formed on at least one side face 21c of the at least one of the plurality of electronic components 21, 21', 21", 31, and a space S, S', S", S1 is formed between two adjacent electronic components 21, 21', 21", 31, such that at least one side of the space S, S', S", S1 includes the slope surface P.

The encapsulation layer 24 is formed on the carrier structure 20 for encapsulating the plurality of electronic components 21, 21', 21", 31.

In an embodiment, the structures of the plurality of electronic components 21, 21', 21", 31 are different from one another.

In an embodiment, the active faces 21a of the electronic components 21, 21', 21" include a plurality of electrode pads 210 electrically connected with the carrier structure 20.

In an embodiment, a chamfer B is formed at a corner between the active face 21a and the side face 21c of the electronic components 21'.

In an embodiment, the width R of the space S, S', S", S1 gradually reduces as it gets towards the carrier structure 20.

In an embodiment, the electronic components 21, 21', 21", 31 are electrically connected with the carrier structure 20 via a plurality of conductive bumps 22. Furthermore, a covering layer 23 is formed between the electronic components 21, 21', 21", 31 and the carrier structure 20, so that the plurality of conductive bumps 22 are covered by the covering layer 23. The covering layer 23 is further covered by the encapsulation layer 24.

In an embodiment, the non-active faces 21b of the electronic components 21' are exposed from the upper surface 24b of the encapsulation layer 24.

In an embodiment, the electronic package 2, 2', 2", 3, 3', 4 further includes a plurality of conductive components 25 on a side of the carrier structure 20 opposite to the side on which the electronic components 21 are disposed.

In conclusion, the electronic package and the manufacturing method thereof in accordance with the present disclosure forms tapered space(s) by slope surfaces of the electronic components to reduce the internal stress of the electronic components exerted by the encapsulation layer and disperse the stress in the electronic components to prevent cracking of the electronic components due to stress concentration and improve the reliability of the electronic package.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
   a carrier structure;
   a plurality of electronic components disposed at intervals on the carrier structure, wherein each of the electronic components includes an active face, a non-active face opposite to the active face, and side faces adjacent to and interconnected between the active face and the non-active face, wherein a width of the active face of at least one of the plurality of electronic components is greater than a width of the non-active face, such that a slope surface is formed on at least one of the side faces of the at least one of the plurality of electronic components, and wherein a space is formed between the two adjacent electronic components, such that at least one side of the space includes the slope surface; and
   an encapsulation layer formed on the carrier structure for encapsulating the plurality of electronic components, wherein structures of the plurality of electronic components are different from one another.

2. The electronic package of claim 1, wherein the active faces of the electronic components include a plurality of electrode pads electrically connected with the carrier structure.

3. The electronic package of claim 1, wherein a chamfer is formed at a corner between the active face and the side face of the electronic components.

4. The electronic package of claim 1, wherein a width of the space gradually reduces as the width of the space gets towards the carrier structure.

5. The electronic package of claim 1, wherein the electronic components are electrically connected with the carrier structure via a plurality of conductive bumps.

6. The electronic package of claim 5, further comprising a covering layer formed between the electronic components and the carrier structure, wherein the plurality of conductive bumps are covered by the covering layer, and the covering layer is further covered by the encapsulation layer.

7. The electronic package of claim 1, wherein the non-active faces of the electronic components are exposed from the encapsulation layer.

8. The electronic package of claim 1, wherein a plurality of the spaces are formed by the plurality of electronic components.

9. The electronic package of claim 1, further comprising a plurality of conductive components on a side of the carrier structure opposite to the side that the electronic components are disposed on.

10. A method of manufacturing an electronic package, comprising:
    providing a plurality of electronic components, wherein each of the electronic components includes an active face, a non-active face opposite to the active face, and side faces adjacent to and interconnected between the active face and the non-active face, and wherein a width of the active face of at least one of the plurality of electronic components is greater than a width of the non-active face, such that a slope surface is formed on at least one of the side faces of the at least one of the plurality of electronic components;
    disposing the plurality of electronic components at intervals on a carrier structure to form a space between the two adjacent electronic components, wherein at least one side of the space includes the slope surface; and
    forming an encapsulation layer on the carrier structure for encapsulating the plurality of electronic components, wherein structures of the plurality of electronic components are different from one another.

11. The method of claim 10, wherein the active faces of the electronic components include a plurality of electrode pads electrically connected with the carrier structure.

12. The method of claim 10, wherein a chamfer is formed at a corner between the active face and the side face of the electronic components.

13. The method of claim 10, wherein a width of the space gradually reduces as the width of the space gets towards the carrier structure.

14. The method of claim 10, wherein the electronic components are electrically connected with the carrier structure via a plurality of conductive bumps.

15. The method of claim 14, further comprising, before forming the encapsulation layer, forming a covering layer between the electronic components and the carrier structure, wherein the plurality of conductive bumps are covered by the covering layer, and the covering layer is covered by the encapsulation layer when forming the encapsulation layer.

16. The method of claim 10, wherein the non-active faces of the electronic components are exposed from the encapsulation layer.

17. The method of claim 10, wherein a plurality of the spaces are formed by the plurality of electronic components.

18. The method of claim 10, further comprising forming a plurality of conductive components on a side of the carrier structure opposite to the side that the electronic components are disposed on.

* * * * *